(12) United States Patent
Chen

(10) Patent No.: US 7,997,766 B2
(45) Date of Patent: Aug. 16, 2011

(54) LIGHT-EMITTING DISPLAY PANEL

(75) Inventor: Jen-Shyan Chen, Hsinchu (TW)

(73) Assignee: Neobulb Technologies, Inc. (BN)

( * ) Notice: Subject to any disclaimer, the term of this patent is extended or adjusted under 35 U.S.C. 154(b) by 205 days.

(21) Appl. No.: 11/989,197

(22) PCT Filed: Jul. 22, 2005

(86) PCT No.: PCT/CN2005/001103
§ 371 (c)(1),
(2), (4) Date: Jan. 22, 2008

(87) PCT Pub. No.: WO2007/009296
PCT Pub. Date: Jan. 25, 2007

(65) Prior Publication Data
US 2009/0262534 A1    Oct. 22, 2009

(30) Foreign Application Priority Data
Jul. 21, 2005   (CN) ...................... 2005 2 0113114 U

(51) Int. Cl.
*F21V 29/00*    (2006.01)

(52) U.S. Cl. ..................... 362/294; 362/373; 362/249.02
(58) Field of Classification Search .................. 362/294, 362/373, 547, 249.02; 349/69
See application file for complete search history.

(56) References Cited

U.S. PATENT DOCUMENTS

| | | | |
|---|---|---|---|
| 5,857,767 A | 1/1999 | Hochstein | |
| 6,874,910 B2 * | 4/2005 | Sugimoto et al. | 362/294 |
| 6,910,794 B2 * | 6/2005 | Rice | 362/547 |
| 6,966,674 B2 * | 11/2005 | Tsai | 362/294 |
| 7,438,448 B2 * | 10/2008 | Chen | 362/373 |
| 7,736,027 B2 * | 6/2010 | Ge | 362/294 |
| 2004/0120152 A1 | 6/2004 | Bolta et al. | |
| 2006/0092639 A1 | 5/2006 | Livesay et al. | |

FOREIGN PATENT DOCUMENTS

| | | |
|---|---|---|
| CN | 1560672 A | 6/2004 |
| CN | 1605795 A | 10/2004 |
| CN | 1680749 A | 10/2004 |
| JP | 2005-093097 | 9/2003 |

* cited by examiner

*Primary Examiner* — Robert May
(74) *Attorney, Agent, or Firm* — Thomas, Kayden, Horstemeyer & Risley, LLP.

(57) ABSTRACT

The invention relates to a light-emitting display including a front plate, N heat-conducting/dissipating apparatuses, and N light-emitting apparatuses, wherein N is a natural number. The front plate has N formed-through apertures thereon. Each of the N heat-conducting/dissipating apparatuses, corresponding to one of the N formed-through apertures and one of the N light-emitting apparatuses, is inserted into the corresponding aperture via a neck portion thereof. Each of the N light-emitting apparatuses is mounted on the flat portion of the corresponding heat-conducting/dissipating apparatus. Thereby, the heat generated during the operation of each of the N light-emitting apparatuses is conducted by the corresponding heat-conducting/dissipating apparatus to the back side of the front plate, and then it is dissipated by the corresponding heat-conducting/dissipating apparatus.

5 Claims, 2 Drawing Sheets

LIGHT-EMITTING DISPLAY PANEL

BACKGROUND OF THE INVENTION

1. Field of the Invention

The present invention relates to a light-emitting display panel; in particular, respective light-emitting apparatuses of the light-emitting display panel according to the invention are engaged to highly efficient heat-conducting/dissipating apparatuses, so that the respective light-emitting apparatuses can operate under high power to increase the light-emitting intensity of each of the respective light-emitting apparatuses.

2. Description of the Prior Art

Light-emitting diodes are a kind of emerging lighting source which has many advantages, such as power-saving, shake-resistant, rapidly-responding, and applicable to mass production. Many of the current light-emitting display panels adapt the light-emitting diodes as a light-emitting source of light-emitting apparatuses, and these light-emitting display panels are widely applied in many situations, such as traffic signals, advertising boards, scoreboards in fields, etc.

However, if the light-emitting intensity of a light-emitting diode needs to be increased, a bigger emitter chip is required, and a larger amount of heat is also generated. After continuous light emission of the light-emitting diode for a period of time, the light-emitting diode will have the problem of an increased junction temperature, causing the light-emitting efficiency of the light-emitting diode to drop, which in turn makes the brightness of the light-emitting diode not able to increase. Therefore, in order to increase the light-emitting efficiency of a light-emitting diode, the light-emitting diode is always required to operate under high power (at least greater than 1 watt), and the light-emitting apparatus using the light-emitting diode as a light-emitting source is also required to be equipped with a good heat-dissipating mechanism, so as to maintain the brightness and to prolong the product life of the light-emitting diode.

The current light-emitting display panels adapting light-emitting diodes as a light source mostly engages the packaged light-emitting diodes to or inserts the packaged light-emitting diodes into a front plate. Because the power of the light-emitting diodes is less than 1 watt, the problem of heat-dissipation is not serious. The light-emitting display panel, according to the invention, is engaged to high-power heat-conducting/dissipating apparatuses; thus, the light-emitting display panel can use high-power light-emitting diodes or other high-power light-emitting apparatuses as a light-emitting source and can dissipate heat by conduction to avoid damages to the emitter chip when the junction temperature of the emitter chip exceeds the safety range.

Accordingly, a scope of the invention is to provide a light-emitting display panel capable of carrying many high-brightness light-emitting apparatuses while having a good heat-conducting device. The thermal resistance of the light-emitting display panel is decreased immediately inside the packaged layers to achieve the effect of partial heat dissipation, to effectively lower the junction temperature of the emitter chip, and to provide a light-emitting effect with high intensity, in addition to resolving the heat dissipation problems of the prior art.

SUMMARY OF THE INVENTION

A scope of the invention is to provide a light-emitting display panel. The light-emitting display panel, according to the invention, includes a front plate, N heat-conducting/dissipating apparatuses, and N light-emitting devices, wherein N is a natural number.

The front plate thereon defines a front side and a back side, and the front plate thereon provides N formed-through apertures. Each of the N heat-conducting/dissipating apparatuses corresponds to one of the N apertures, and each heat-conducting/dissipating apparatus includes a heat-conducting device and at least one heat-dissipating fin. The heat-conducting device is divided into a neck portion adapted for the corresponding aperture, a flat portion at the distal end of the neck portion, and a tail portion. The heat-conducting device is inserted into the corresponding aperture via the neck portion thereof, so that the tail portion of the heat-conducting device is positioned on the back side of the front plate. The at least one heat-dissipating fin is mounted on the circumference of the tail portion of the heat-conducting device. Each of the N light-emitting apparatuses corresponds to one of the N apertures and is mounted on the flat portion of the heat-conducting device that is inserted into the corresponding aperture.

Thereby, the heat produced during the operation of each of the N light-emitting apparatuses is conducted to the back side of the front plate by the heat-conducting device corresponding to the light-emitting apparatus, and then it is dissipated into the surrounding air by the at least one heat-dissipating fin corresponding to the light-emitting apparatus.

The light-emitting display panel, according to the invention, therein includes a light engine which effectively integrates the N heat-conducting/dissipating apparatuses with the N light-emitting apparatuses into an independent light engine having a heat-dissipating function. The heat generated by the N light-emitting apparatuses can be effectively conducted by the cylindrical heat-conducting device. The heat-conducting device not only has a larger surface area compared to that of the prior art, but can also conduct the heat away from the N light-emitting apparatuses and can dissipate the heat into the surrounding air by the at least one heat-dissipating fin to substantially increase the heat-dissipating efficiency. Compared with prior art, because the N light-emitting apparatuses are flatly mounted on the flat portion of the heat-conducting device, the N light-emitting apparatuses of the light-emitting display panel, according to the invention, can effectively lower the junction temperature, allowing the light-emitting display panel to be able to utilize the high-power light-emitting diodes to display words and graphic files and to serve as a planar lighting source.

The light-emitting display panel, according to the invention, can integrate the light-emitting apparatuses with the heat-conducting/dissipating apparatuses into an independent member that can effectively dissipate heat and has a better heat-dissipating efficiency.

The advantage and spirit of the invention may be understood by the following recitations together with the appended drawings.

BRIEF DESCRIPTION OF THE APPENDED DRAWINGS

DETAILED DESCRIPTION OF THE INVENTION

The present invention provides a light-emitting display panel made up of N high-power light-emitting apparatuses, and the light-emitting display panel can prevent the light-emitting efficiency and product life of the emitter chip to decrease when the temperature at the P-N junction becomes exceedingly high.

Figure 1:
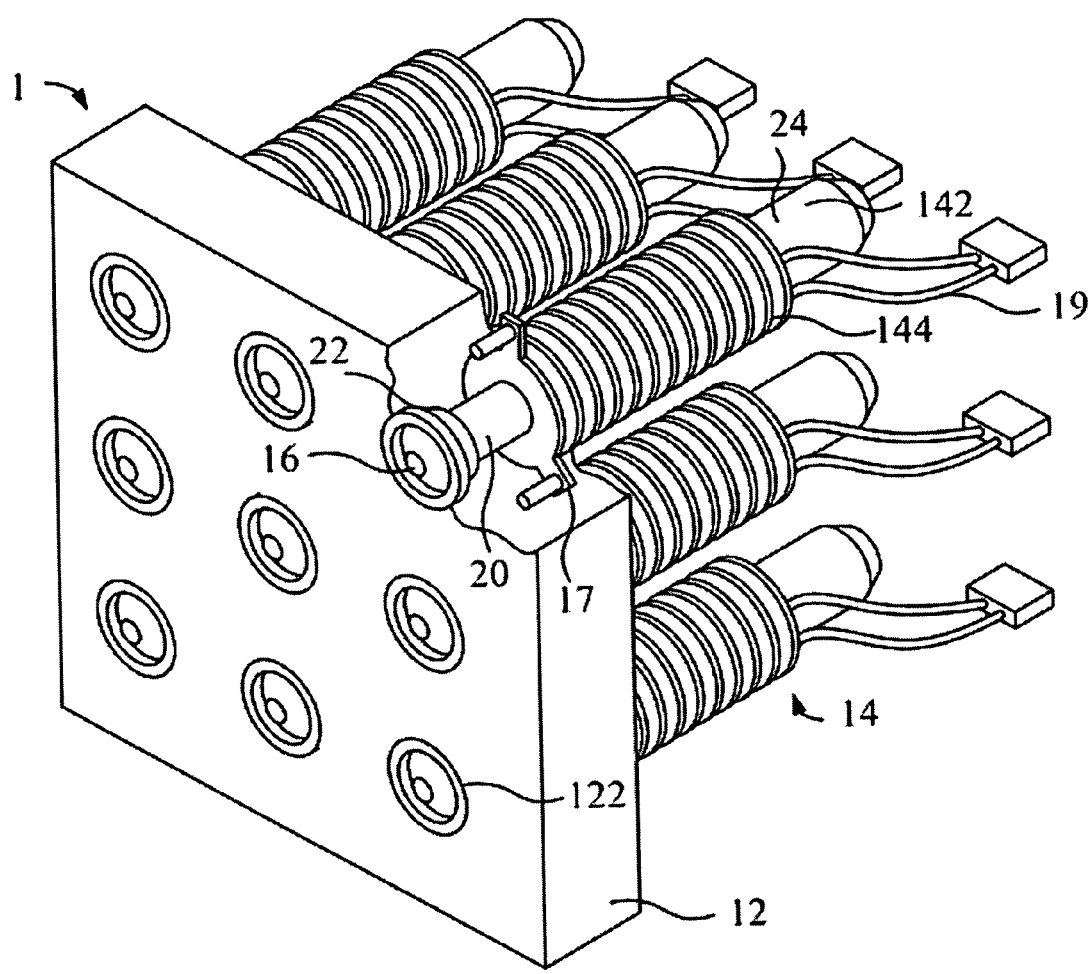
FIG. 1 is a partial outside perspective view of the light-emitting display panel according to a first preferred embodiment of the invention.

Referring to FIG. 1, FIG. 1 is an outside perspective view of a first preferred embodiment according to the invention. As shown in FIG. 1, the light-emitting display panel 1 includes a front plate 12, N heat-conducting/dissipating apparatuses 14, and N light-emitting apparatuses 16. N is a natural number.

The front plate 12 thereon defines a front side and a back side, and the front plate 12 has thereon N formed-through apertures 122. The inner diameter of each of the N apertures 122 is slightly greater than the external diameter of the light-emitting apparatus 16 corresponding to the aperture 122. The front plate 12 is made from one selected from the group consisting of a cement material, a glass material, a metal material, a wooden material, a polymeric material, a cement/polymer composite, and a ceramic/polymer composite.

Each of the N heat-conducting/dissipating apparatuses 14 corresponds to one of the N apertures 122. Each of the N heat-conducting/dissipating apparatuses 14 includes a heat-conducting device 142 and at least one heat-dissipating fin 144. The heat-conducting device 142 is divided into a neck portion 20 adapted for the corresponding aperture 122, a flat portion 22 at the distal end of the neck portion 20, and a tail portion 24. The heat-conducting device 142 is inserted through the corresponding aperture 122 via the neck portion 20 thereof, and it uses screws or other gadgets to mount on the back side of the front plate 12, so that the tail portion 24 of the heat-conducting device 142 is positioned on the back side of the front plate 12. In this embodiment of the invention, each heat-conducting device 142 also uses a fastening device 17, mounted on the heat-conducting device 142, to fasten the heat-conducting device 142 on the back side of the front plate 12. The at least one heat-dissipating fin 144 is mounted on the circumference of the tail portion 24 of the heat-conducting device 142. Thereby, the heat generated during the operation of the N light-emitting apparatuses 16 is conducted to the at least one heat-dissipating fin 144 by the N heat-conducting devices 142, and then it is dissipated by the at least one heat-dissipating fin 144.

In one embodiment of the invention, the N light-emitting apparatuses 14 of the light-emitting display panel 1, according to the invention, are arranged in the form of an array on the front plate 12.

Each of the N light-emitting apparatuses 16 corresponds to one of the N apertures 122 and is mounted on the flat portion 22 of the heat-conducting device 142 being inserted through the corresponding aperture 122. Each light-emitting apparatus 16 further comprises at least two conducting wires 19 for electrically connecting to a power source or a ground.

Figure 2:
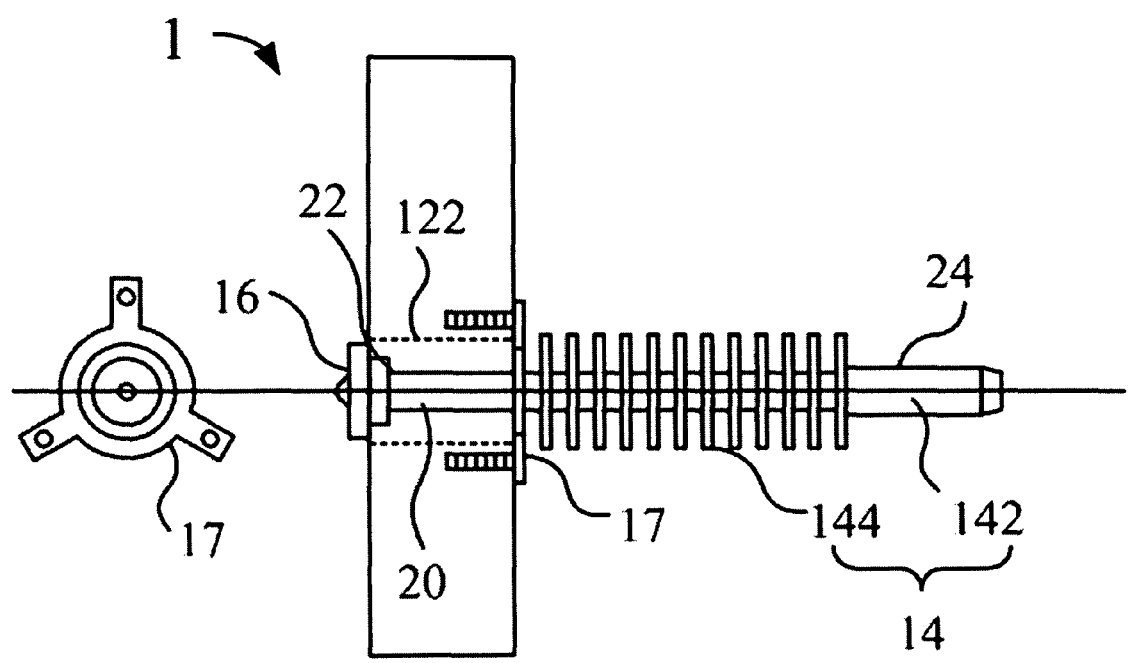
FIG. 2 is a side view of the light-emitting display panel according to the first preferred embodiment of the invention.

Referring to FIG. 2, FIG. 2 is a side view of the light-emitting display panel according to the first preferred embodiment of the invention. As shown in FIG. 2, the heat-conducting device 142 included in each heat-conducting/dissipating apparatus 14 is substantially cylindrical-shaped. In one embodiment of the invention, the heat-conducting device 142 is a heat pipe, a heat column, or a material with high heat conductivity, such as a cylinder composed of copper and aluminum; the length of the cylinder exceeds twice the maximum width of the at least one flat portion 22. The flat portion 22 of the heat-conducting device 142 is made by additional processing during the production of the cylindrical-shaped heat-conducting device. The heat-conducting device 142 is inserted into the corresponding aperture 122 via the neck portion 20 thereof, and it uses the fastening device 17 to fasten onto the back side of the front plate 12, so that the tail portion 24 of the heat-conducting device 142 is positioned on the back side of the front plate 12. The light-emitting apparatus 16 includes at least one semiconductor light-emitting die which is a light-emitting diode die or a laser diode die. The base of the light-emitting apparatus 16, made from a polymeric material, a metal material, a semiconductor material, or a ceramic material, is mounted flatly on the flat portion 22 of the heat-conducting device 142.

When a light-emitting apparatus 16 of the light-emitting display panel 1 is connected to the power source, the heat generated during the operation of the light-emitting device 16 is conducted by the at least one flat portion 22 of the heat-conducting device 142 to the at least one heat-dissipating fin 144, and then it is dissipated by the at least one heat-dissipating fin 144. The light-emitting apparatus 16, according to the invention, is mounted flatly and seamlessly on the at least one flat portion 22 of the heat-conducting device 142 and keeps a distance away from the connected power source or the controlling module, so as to avoid the power source or the controlling circuit module from being directly affected by the heat generated by the light-emitting apparatus 16.

The invention effectively integrates the N heat-conducting/dissipating devices 14 with the N light-emitting apparatuses 16 into a light engine, which has a highly efficient heat-dissipating function. The invention effectively lowers the junction temperature of the semiconductor light-emitting die inside the light-emitting apparatuses 16 by mounting the light-emitting device 16 flatly on the flat portion 22 of the heat-conducting device 142 and then conducting the heat away by the substantially cylindrical-shaped structure of the heat-conducting device 142. The heat-conducting device 142 not only has a larger heat-dissipating area compared with that of the prior art but can also conduct the heat away from the light-emitting apparatuses 16 through its front pate 12.

In one embodiment of the invention, the light-emitting display panel, according to the invention, further comprises a power providing/controlling unit for controlling the N light-emitting apparatuses. Each of the N light-emitting apparatuses is electrically connected to the power providing/controlling unit through the at least two conducting wires. The controlling module is capable of controlling the N light-emitting apparatuses to exert different colors for displaying word and graphic files, and it is also capable of controlling the N light-emitting apparatuses to simultaneously emit light to serve as a planar lighting source.

The light-emitting display panel, according to the invention, first conducts the heat away from the light-emitting apparatuses by the heat-conducting devices, and then it immediately dissipates heat into the surrounding air by the at least one heat-dissipating fin to substantially increase the heat-dissipating efficiency. By improving the heat-dissipating efficiency, the problem of decreased efficiency of the semiconductor light-emitting die caused by overheating is resolved.

Accordingly, the light-emitting display panel, according to the invention, is mounted flatly on the flat portion of the heat-conducting device, and it conducts heat away by the substantially cylindrical-shaped structure of the heat-conducting device to effectively lower the junction temperature of the semiconductor light-emitting die, so that the light-emitting devices according to the invention can be actuated to a higher watt (greater than 5 watts), causing the light-emitting efficiency of the light-emitting display panel to substantially increase to serve not only as a display board but also as a lighting source.

With the example and explanations above, the features and spirits of the invention will be hopefully well described.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A light-emitting display panel, comprising:
   a front plate thereon defining a front side and a back side, and the front plate thereon providing N formed-through apertures, N being a natural number;
   N heat-conducting/dissipating apparatuses which each corresponds to one of the N-formed through apertures, each of the N heat-conducting/dissipating apparatuses comprising:
     a cylindrical heat pipe with a flat end surface and a sidewall divided into a neck portion adapted for the corresponding aperture, the neck portion comprising the flat end surface and a part of the sidewall, the flat end surface being perpendicular to an extension direction of the sidewall at the distal end of the neck portion, and a tail portion, the cylindrical heat pipe being composed of copper and inserted into the corresponding aperture via the neck portion thereof, a part of the neck portion being disposed within the thickness of the front plate, such that the tail portion of the cylindrical heat pipe is positioned on the back side of the front plate; and
     at least one heat-dissipating fin mounted on a circumference of the tail portion of the cylindrical heat pipe;
   wherein the length of the cylindrical heat pipe exceeds twice the maximum width of the flat surface;
   a fastening device for fastening the heat-conducting/dissipating apparatus to the back side of the front plate; and
   N light-emitting apparatuses, which each corresponds to one of the N apertures, being mounted on the flat surface of the cylindrical heat pipe inserted into the corresponding aperture, wherein each of the N light-emitting apparatuses comprises at least one semiconductor light-emitting diodes, and all of at least one semiconductor light-emitting diodes are disposed within periphery of the flat portion;
   whereby the heat generated during the operation of each of the N light-emitting apparatuses is conducted by the cylindrical heat pipe corresponding to said one light-emitting apparatus to the back side of the front plate, and then dissipated by the at least one heat-dissipating fin corresponding to said one light-emitting apparatus.

2. The light-emitting display panel of claim 1, wherein the N light-emitting apparatuses are arranged in the form of an array on the front side of the front plate.

3. The light-emitting display panel of claim 1, further comprising a power supplying/controlling unit, wherein each of the N light-emitting apparatuses has at least two conducting wires electrically connected to the power supplying/controlling unit.

4. The light-emitting display panel of claim 1, wherein the front plate is made from one selected from the group consisting of a cement material, a glass material, a metal material, a wooden material, a polymeric material, a cement/polymer composite, and a ceramic/polymer composite.

5. The light-emitting display panel of claim 1, wherein the inner diameter of each of the apertures in the front plate is slightly bigger than the external diameter of the corresponding light-emitting apparatus.

* * * * *